(12) United States Patent
Yao et al.

(10) Patent No.: US 9,170,494 B2
(45) Date of Patent: Oct. 27, 2015

(54) ANTIREFLECTIVE COMPOSITIONS AND METHODS OF USING SAME

(75) Inventors: Huirong Yao, Plainboro, NJ (US); Guanyang Lin, Whitehouse Station, NJ (US); JoonYeon Cho, Bridgewater, NJ (US)

(73) Assignee: AZ ELECTRONIC MATERIALS (LUXEMBOURG) S.A.R.L., Luxembourg (LU)

( * ) Notice: Subject to any disclaimer, the term of this patent is extended or adjusted under 35 U.S.C. 154(b) by 0 days.

(21) Appl. No.: 13/527,156

(22) Filed: Jun. 19, 2012

(65) Prior Publication Data

US 2013/0337379 A1    Dec. 19, 2013

(51) Int. Cl.
*G03F 7/11*     (2006.01)
*G03F 7/20*     (2006.01)
*G03F 7/40*     (2006.01)
*G03F 7/09*     (2006.01)
*G03F 7/16*     (2006.01)

(52) U.S. Cl.
CPC ............... *G03F 7/091* (2013.01); *G03F 7/168* (2013.01); *G03F 7/40* (2013.01)

(58) Field of Classification Search
None
See application file for complete search history.

(56) References Cited

U.S. PATENT DOCUMENTS

| | | | |
|---|---|---|---|
| 3,474,054 A | 10/1969 | Marion | |
| 3,519,627 A * | 7/1970 | Nordstrom et al. | 544/197 |
| 3,962,188 A | 6/1976 | Kauffman | |
| 3,962,191 A | 6/1976 | Kauffman | |
| 4,200,729 A | 4/1980 | Calbo | |
| 4,251,665 A | 2/1981 | Calbo | |
| 4,491,628 A | 1/1985 | Ito et al. | |
| 5,187,019 A | 2/1993 | Calbo et al. | |
| 5,350,600 A | 9/1994 | Kubota | |
| 5,843,624 A | 12/1998 | Houlihan et al. | |
| 5,998,099 A | 12/1999 | Houlihan et al. | |
| 6,042,992 A | 3/2000 | Dammel et al. | |
| 6,132,946 A | 10/2000 | Takizawa et al. | |
| 7,081,511 B2 | 7/2006 | Wu et al. | |
| 7,264,913 B2 | 9/2007 | Wu et al. | |
| 7,332,266 B2 | 2/2008 | Kishioka et al. | |
| 7,416,834 B2 | 8/2008 | Abdallah et al. | |
| 7,553,905 B2 | 6/2009 | Abdallah et al. | |
| 7,638,262 B2 | 12/2009 | Wu et al. | |
| 7,691,556 B2 | 4/2010 | Wu et al. | |
| 7,795,369 B2 | 9/2010 | Enomoto et al. | |
| 7,932,018 B2 | 4/2011 | McKenzie et al. | |
| 7,989,144 B2 | 8/2011 | Rahman et al. | |
| 8,221,965 B2 | 7/2012 | Yao et al. | |
| 8,329,387 B2 | 12/2012 | Yao et al. | |
| 8,445,175 B2 | 5/2013 | Hiroi et al. | |
| 8,507,192 B2 | 8/2013 | Yao et al. | |
| 2006/0057491 A1 | 3/2006 | Wayton et al. | |
| 2006/0290429 A1 | 12/2006 | Kishioka et al. | |
| 2008/0102649 A1 | 5/2008 | Takei et al. | |
| 2008/0176165 A1 * | 7/2008 | Xiang et al. | 430/270.1 |
| 2008/0318167 A1 | 12/2008 | Kin et al. | |
| 2009/0035704 A1 | 2/2009 | Zhuang et al. | |
| 2009/0042133 A1 | 2/2009 | Xiang et al. | |
| 2009/0274944 A1 | 11/2009 | Hasegawa et al. | |
| 2009/0274974 A1 | 11/2009 | Abdallah et al. | |
| 2009/0280434 A1 | 11/2009 | Harada et al. | |
| 2009/0311624 A1 | 12/2009 | Horiguchi et al. | |
| 2010/0009293 A1 * | 1/2010 | Yao et al. | 430/312 |
| 2010/0092894 A1 | 4/2010 | Liu et al. | |

FOREIGN PATENT DOCUMENTS

WO    WO-2007/028792 A1 *   3/2007

OTHER PUBLICATIONS

Notification of the First Office Action dated Nov. 2, 2012 for Chinese Patent Application No. 200980120772.6, which corresponds to U.S. Appl. No. 12/133,562.
English Translation of Notification of the First Office Action dated Nov. 2, 2012 for Chinese Patent Application No. 200980120772.6, which corresponds to U.S. Appl. No. 12/133,562.
Notification of the Second Office Action dated Jul. 3, 2013 for Chinese Patent Application No. 200980120772.6, which corresponds to U.S. Appl. No. 12/133,562.
English Translation of Notification of the Second Office Action dated Jul. 3, 2013 for Chinese Patent Application No. 200980120772.6, which corresponds to U.S. Appl. No. 12/133,562.
Notification of the Third Office Action dated Feb. 8, 2014 for Chinese Patent Application No. 200980120772.6, which corresponds to U.S. Appl. No. 12/133,562.
English Translation of Notification of the Third Office Action dated Feb. 8, 2014 for Chinese Patent Application No. 200980120772.6, which corresponds to U.S. Appl. No. 12/133,562.
Office Action delivery date Jan. 12, 2014 from the Korean Intellectual Property Office for Patent Application No. KR 10-2010-7027320, which corresponds to U.S. Appl. No. 12/133,562.
Eng.Trans. Of Office Action delivery date Jan. 12, 2014 from the KIPO for Patent Application No. KR 10-2010-7027320, which corresponds to U.S. Appl. No. 12/133,562.

(Continued)

*Primary Examiner* — Cynthia Hamilton

(74) *Attorney, Agent, or Firm* — Mitchell Brustein

(57) ABSTRACT

The present invention relates to a novel antireflective coating composition comprising a polymer obtained from a reaction product of at least one amino compound chosen from the group consisting of a polymer with repeat unit of structure (1), structure (2) and mixtures thereof reacted with a hydroxy compound chosen from the group consisting of structure (3), structure (4) and mixtures thereof, and, a thermal acid generator. The invention also relates to a process for using the novel composition in lithography.

17 Claims, No Drawings

(56) References Cited

OTHER PUBLICATIONS

Office Action delivery date Jan. 20, 2014 from the Korean Intellectual Property Office for Patent Application No. KR 10-2010-7027326, which corresponds to U.S. Appl. No. 12/133,567.

Eng.Trans. Of Office Action delivery date Jan. 20, 2014 from the KIPO for Patent Application No. KR 10-2010-7027326, which corresponds to U.S. Appl. No. 12/133,567.

Notification of the First Office Action dated Dec. 2, 2013 for CN 201180007899.4, which corresponds to U.S. Appl. No. 12/708,205.

English Translation of Notification of the First Office Action dated Dec. 2, 2013 for CN 201180007899.4, which corresponds to U.S. Appl. No. 12/708,205.

Notification of the Second Office Action dated May 28, 2014 for CN 201180007899.4, which corresponds to U.S. Appl. No. 12/708,205.

English Translation of Notification of the Second Office Action dated May 28, 2014 for CN 201180007899.4, which corresponds to U.S. Appl. No. 12/708,205.

Eng. Lang.Translation of Office Action delivery mailed Jul. 30, 2014 from the JPO for Patent Application No. JP 2011-517254, which corresponds to U.S. Appl. No. 12/133,567.

English Translation of Official Action from JPO for JP 2012-553412 mailed on Feb. 4, 2015, which corresponds to U.S. Appl. No. 12/708,205.

Office Action with Search Report issuance date Sep. 30, 2014 for Taiwanese Patent Application No. 098114508, which corresponds to U.S. Appl. No. 12/133,562.

English Translation of the Office Action with Search Report issuance date Sep. 30, 2014 for Taiwanese Patent Application No. 098114508, which corresponds to U.S. Appl. No. 12/133,562.

Office Action with Search Report for TW 100105167 issued Jan. 6, 2015, which corresponds to U.S. Appl. No. 12/708,205.

English Translation of Office Action with Search Report for TW 100105167 issued Jan. 6, 2015, which corresponds to U.S. Appl. No. 12/708,205.

\* cited by examiner

ANTIREFLECTIVE COMPOSITIONS AND METHODS OF USING SAME

The present invention relates to novel antireflective compositions comprising at least one polymer chosen from a polymelamine copolymer or a glycoluril polymer, and further comprises a thermal acid generator. The present invention also relates to methods of using these novel materials as antireflective substrate coatings in photolithographic processes.

Photolithography is a photo-chemical process for forming a photoresist pattern, which can then be transferred to the substrate by etching. Such photo-chemical processes are used to make integrated circuits and computer chips. An integrated circuit is made from a silicon wafer, known as a substrate, having a complete electronic circuit incorporated on its surface.

Typically in such a microlithographic processes, a substrate is coated with a thin photosensitive film, known as a photoresist. Then, the photoresist-coated substrate is baked to evaporate any solvent in the photoresist composition and to fix the coating onto the substrate. The baked photoresist-coated surface of the substrate is subsequently subjected to an image-wise exposure to radiation.

Upon radiation exposure, the exposed areas of the coated surface undergo a chemical transformation. Forms of radiation commonly used in microlithographic processes, including immersion lithography, include visible light, ultraviolet (UV) light, electron beam, extreme ultra violet (euv) and X-ray radiant energy. Typically, the radiation exposure is accomplished by radiating the film with light of a select wavelength through a patterned mask. The exposed photoresist delineates the pattern that is transferred to the substrate, and eventually incorporated into the integrated circuit. After this image-wise exposure, the coated substrate is treated with a developer solution to dissolve and remove either the radiation-exposed or the unexposed areas of the photoresist.

Integrated circuits (IC) are becoming increasingly smaller with photolithographic processes producing circuit elements with dimensions that are sub-micrometer, e.g., about one-half of a micrometer. However, scattered light that reflects off the substrate during the exposure step of photolithography interferes with the desired exposure profiles, and thus with attaining sub-micron IC elements.

Absorbing antireflective coatings are used in photolithography to reduce problems that result from back reflection of light from highly reflective substrates. Examples of antireflective coatings are described in U.S. Pat. No. 7,553,905, US 2009/0246691, US 2009/0274974, and US 2009/0280435, which are incorporated herein by reference in their entirety.

An antireflective coating that is coated beneath a photoresist and above a reflective substrate provides considerable improvement in lithographic performance of the photoresist. Such an antireflective coating is known as a bottom antireflective coating (BARC). Typically, the bottom antireflective coating is coated onto the substrate and then a layer of photoresist is coated on top of the antireflective coating. The antireflective coating is baked (cured) to prevent intermixing between the antireflective coating and the photoresist. The photoresist is exposed image-wise and developed. The antireflective coating in the exposed area is then typically dry etched using various etching gases, thereby transferring the photoresist pattern to the substrate.

In addition to antireflection properties, advanced bottom antireflective coatings also provide enhanced pattern transfer properties to the substrate. As described in U.S. Pat. No. 7,416,834, when a single layer pattern transfer lithography process, high etch rate bottom antireflective coatings preserve photoresist film thickness so the photoresist can act as a thicker mask in transferring the image to the substrate.

The refractive index (n) and the extinction coefficient (k) are fundamental optical properties which are part of the definition of the complex refractive index($n_c$), where $n_c$=n−ik. For lithographic application at a given wavelength, the refractive index (n) and the extinction coefficient (k) of films on substrates are typically measured by modeling data acquired by using a spectroscopic ellipsometer as for instance supplied by the J. A. Woollam Co (Lincoln, Nebr.).

Accordingly, there is a need for better antireflective compositions with high dry etch rate for improved lithographic performance of the imaging process to efficiently accomplish the transfer of a pattern to a substrate so that the line and space patterns are free of defects such as standing waves, footing and scumming.

The present invention relates to novel antireflective compositions comprising at least one polymer chosen from a poly melamine copolymer, or a glycoluril polymer, and further comprises a thermal acid generator. The composition provides for a refractive index (n) below 1.65 and an extinction coefficient (k) below 0.3 at the exposure wavelength of the photoresist, and has a plasma etch rate much faster than the conventional antireflective coatings having similar n and k. The present invention also relates to methods of using these materials as antireflective substrate coatings in photolithographic processes.

SUMMARY OF THE INVENTION

The invention relates to an antireflective coating composition comprising
a) a polymer obtained from a reaction product of at least one amino compound chosen from the group consisting of a polymer with repeat unit of structure (1), structure (2) and mixtures thereof reacted with a hydroxy compound chosen from the group consisting of structure (3), structure (4) and mixtures thereof, and, b) a thermal acid generator,

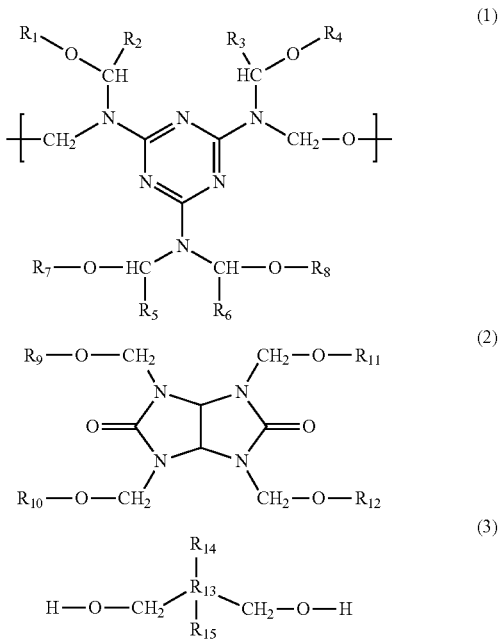

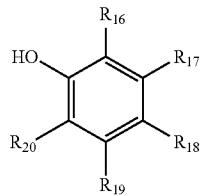

wherein $R_1$, $R_2$, $R_3$, $R_4$, $R_5$, $R_6$, $R_7$, $R_8$, $R_9$, $R_{10}$, $R_{11}$, $R_{12}$ are independently H or a $C_1$-$C_4$ alkyl group; $R_{13}$ is a direct valence bond or a $C_1$-$C_6$ alkylene moiety, and $R_{14}$ and $R_{16}$ are independently selected from a group consisting of a H, $C_1$-$C_6$ alkyl moiety and a carbonyloxyalkyl moiety [—(C═O)—O—$R_{16}$] where $R_{16}$ is a $C_1$-$C_6$ alkyl moiety; n is a positive integer; $R_{16}$, $R_{17}$, $R_{18}$, $R_{19}$, $R_{20}$ are independently selected from a group consisting of H, halogen, $C_1$-$C_6$ alkyl, halogenated $C_1$-$C_6$ alkyl, carbonylalkyl moiety [—(C═O)—$R_{21}$] where $R_{21}$ is a $C_1$-$C_6$ alkyl or OH provided that no more than two OH substituents are present in (4).

The invention also relates to a process for using the novel composition to form an image.

DETAILED DESCRIPTION OF THE INVENTION

The present invention relates to novel antireflective compositions comprising at least one crosslinking polymer chosen from a polymelamine copolymer or a glycoluril polymer, and further comprises a thermal acid generator. The composition may comprise optionally another crosslinking agent, and optionally a secondary polymer polyester or polyacrylate polymer that contains crosslinkable groups, such as hydroxyl, epoxy, amide, urea or carboxylic acid. In one case, the secondary polymer comprises a fluoroalcohol moiety. The composition provides for a refractive index (n) below 1.65 and an extinction coefficient (k) below 0.3. In one embodiment the composition has (n) below 1.6 and (k) below 0.25. In another embodiment the composition has (n) below 1.5 and (k) below 0.2. The n and k values are measured at the exposure wavelength of photoresist coated over the novel antireflective coating. The composition has a plasma etch rate faster than 193 nm photoresists and is compatible with photoresists used to coat over the antireflective coatings. The invention also relates to a process for imaging a photoresist layer coated with the novel antireflective coating layer. In one embodiment a high etch rate and a refractive index of 1.65 or below is achieved using the provided antireflective compositions. In one embodiment the etch rate of the antireflective coating film is 1.4-2.0 times the etch rate of the photoresist film coated above the antireflective film, the refractive index is 1.65 or below 1.6 and the extinction coefficient (k) is below 0.3 or below 0.2.

The present invention relates to an antireflective coating composition comprising a crosslinking polymer and a thermal acid generator. The crosslinking polymer is selected from a reaction product of a compound containing alkyloxymethylamino moieties (-alkyl-O-methyl-amino) and a compound having at least one hydroxy group. The compound having the alkyloxymethylamino moiety structure is chosen from a group consisting of a polymer with structure (1), structure (2) and mixtures thereof. The compound having at least one hydroxy group is chosen from the group consisting of structure (3), structure (4) and mixtures thereof. The reactants are reacted in the presence of an acid catalyst. The concentration of the alkyloxymethylamino compound ranges from 30 to 90% mole %, or 40-80%; the concentration of the hydroxyl compound (3) or (4) ranges from 10 to 70 mole %, or 20-60 mol %. The structures are as follows,

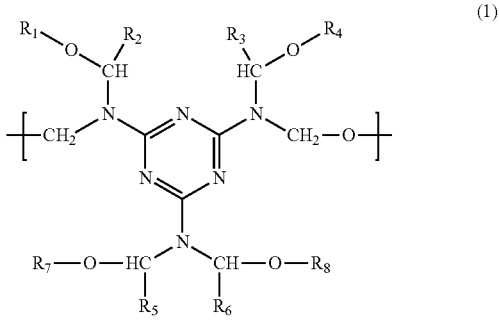

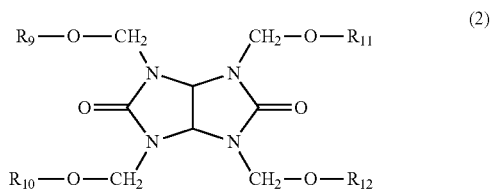

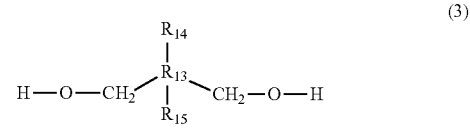

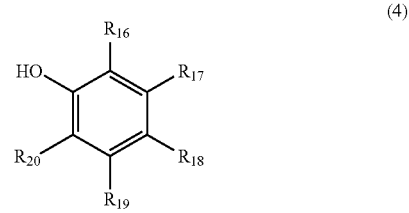

wherein $R_1$, $R_2$, $R_3$, $R_4$, $R_5$, $R_6$, $R_7$, $R_8$, $R_9$, $R_{10}$, $R_{11}$, $R_{12}$ are independently H or a $C_1$-$C_4$ alkyl group; $R_{13}$ is a direct valence bond or a $C_1$-$C_6$ alkylene moiety, and $R_{14}$ and $R_{15}$ are independently selected from a group consisting of a H, $C_1$-$C_6$ alkyl moiety and a carbonyloxyalkyl moiety [—(C═O)—O—$R_{16}$] where $R_{16}$ is a $C_1$-$C_6$ alkyl moiety; n is a positive integer; $R_{16}$, $R_{17}$, $R_{18}$, $R_{19}$, $R_{20}$ are independently selected from a group consisting of H, halogen, $C_1$-$C_6$ alkyl, halogenated $C_1$-$C_6$ alkyl, carbonylalkyl moiety [—(C═O)—$R_{21}$] where $R_{21}$ is a $C_1$-$C_6$ alkyl or OH provided that no more than two OH substituents are present in (4). The repeat unit n may be n=1-10 or 1-5.

In another embodiment of this invention the antireflective coating polymer structure contains structure (1) reacted with the hydroxyl compound; and, in another embodiment of this invention the antireflective coating polymer structure contains structure (2) reacted with the hydroxyl compound.

An example of structure 1 is the structure (5) and an example of structure (2) is the structure (6),

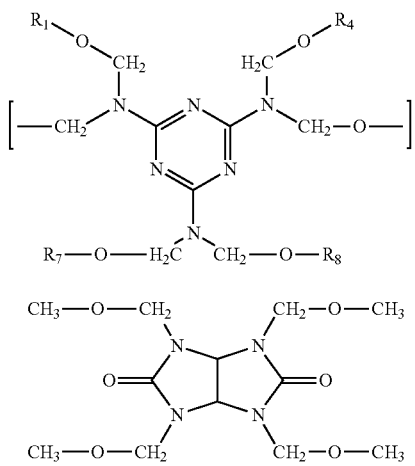

(5)

(6)

wherein $R_1$, $R_4$, $R_7$, $R_8$ are independently H or a $C_1$-$C_4$ alkyl group; and n is a designation of the repeating nature of the unit making up the polymer (5) and n=1-10 or 1-5. In another embodiment of this invention, the antireflective coating composition comprises the reaction product of the compound with structure (1) and compound with a dihydroxy compound chosen from the group consisting of (3) and (4) or mixtures thereof, in the presence of an acid catalyst. In another embodiment, the antireflective coating composition comprises a crosslinking polymer which is the reaction product of a compound with structure (2) and reacted compound with a dihydroxy compound chosen from the group consisting of (3) and (4) or mixtures thereof, in the presence of an acid catalyst.

Examples of structures (3) and (4) have the following structures;

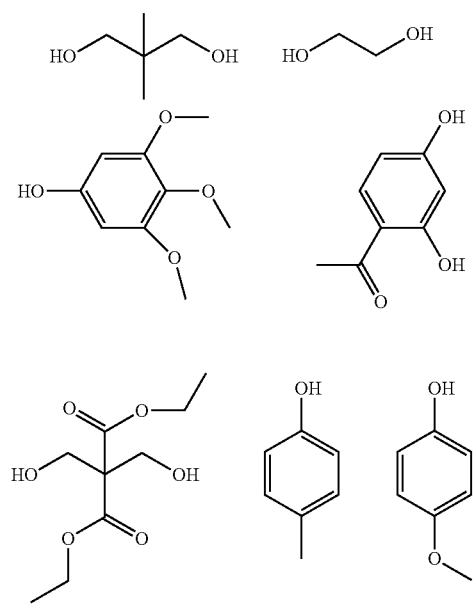

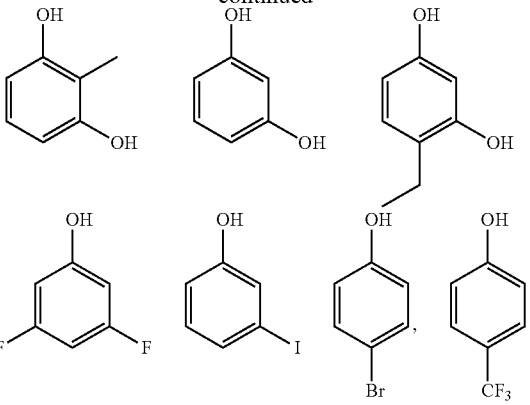

By adjusting the concentrations of components (1), (2), (3), (4) within the ranges described above the antireflective coating composition of this invention can be optimized at 193 nm to have a refractive index below 1.65, e.g. 1.25-1.65 and to simultaneously have an extinction coefficient k which is optimized to be less than 0.3. It is also possible to adjust these components to obtain a refractive index below 1.5 while simultaneously obtaining an extinction coefficient below 0.2. In one embodiment the composition has the extinction coefficient k between 0.05 to 0.25.

Suitable acid catalysts for reacting the compounds to form the crosslinking polymer are any acids, such as sulfonic acids; examples are para-toluenesulfonic acid monohydrate, and other aryl or alkyl sulfonic acids. Typically the reaction is done in a solvents such as ethers, ester or ester/ethers such as tetrahydrofuran, propylene glycol methyl ether acetate and the like. Typically, the reaction is done by heating at about 80° C.-90° C. for 3-24 hours.

The weight average molecular weight of (1) can range from about 300 to about 1,000. The weight average molecular weight of the polymer resulting from reaction of (1) with (3) or (4) by acid catalysis ranges from about 500 to about 10,000. The weight average molecular weight polymers resulting from the reaction of (2) with (3) and or (4) by acid catalysis ranges from 1,000 to about 15,000.

The antireflective composition of the present invention comprises the crosslinking polymer and the thermal acid generator, and may further comprise a secondary polymer. The secondary polymer may be a crosslinkable polymer capable of crosslinking with the crosslinking polymer. The secondary polymer may be selected from a group consisting of polyesters, polyacrylates and polyacrylics. The secondary polymer may be present relative to a total solid content in a range between 2 and 50 wt %, or 5-30 wt %, so as to optimize the refractive index at 193 nm to be below 1.65 and to also optimize the extinction coefficient k to be less than 0.30. More specifically by adjusting the total solids content of the secondary polymer the refractive index n and the extinction coefficient k are optimized to be between 1.6 and 1.4 and 0.05 to 0.25 respectively. Some examples of the secondary polymer are those that comprise at least one unit of structure (7), where $R_{22}$ is a $C_2$-$C_{12}$ alkylene spacer, $R_{23}$ and $R_{24}$ can independently be a hydroxyalkyl, a hydroxylalkyl fluoroalkoxyl, or a hydroxylalkylaryl moiety where a hydroxylalkyl moiety may have structure (8) and a hydroxyalkylaryl may have structure (9) where $R_{26}$, $R_{28}$, $R_{29}$ and $R_{30}$ are independently $C_1$-$C_6$ alkylene spacer, $R_{27}$ is a $C_1$-$C_6$ alkyl group and Rf is a $C_1$-$C_6$ fully fluorinated or partially fluorinated alkyl and Ar is an aromatic group, which is for example phenyl, alkylsubstituted phenyl, naphthyl and alkyl substituted naphthyl and the like.

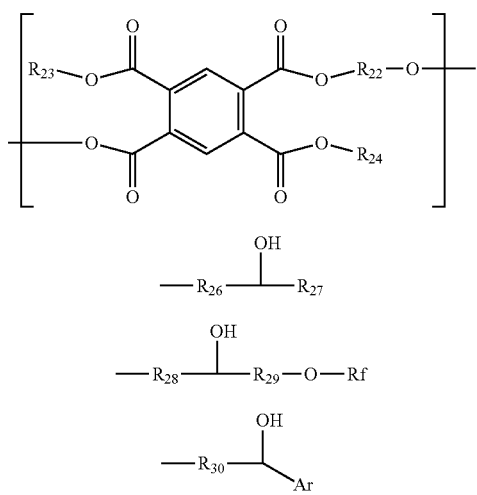
(7)

(8)
—R$_{26}$—$\overset{OH}{\underset{}{C}}$—R$_{27}$ (9)
—R$_{28}$—$\overset{OH}{\underset{}{C}}$—R$_{29}$—O—Rf

(10)
—R$_{30}$—$\overset{OH}{\underset{}{C}}$—Ar

Specific examples of the secondary polymer that comprises the unit of structure (7) are,

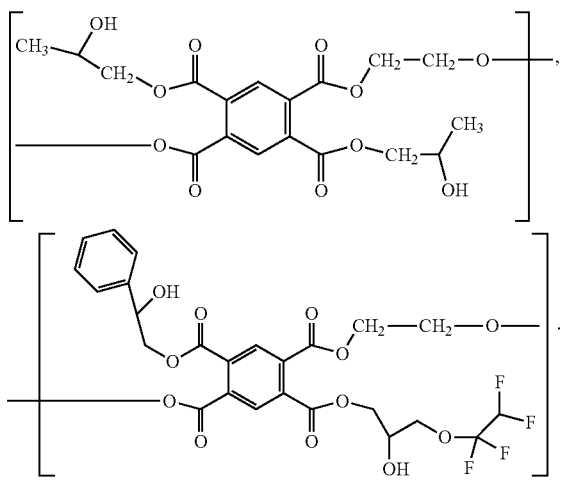

The secondary polymer may be polyacrylates with (i) cross-linkable pendant groups such as those chosen from hydroxyl, epoxy, amide, imide, or carboxylic acid, (ii) pendant fluoroalcohol or fluoroakyl groups, and (iii) pendant alkyloxy or arylalkyloxy groups. The secondary polymer may be present at a concentration of 2 to 50 wt % or 5-30 wt % of the total solid content of the composition. Polyacrylate polymers may be represented by structure (10),

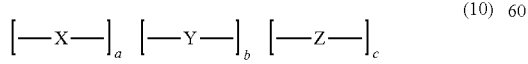
(10)

where X and Y are acrylate repeat units and Z is an optional repeat unit. X are repeat units that contain a pendant crosslinking moiety, Y are repeat units containing a pendant fluoro alcohol or fluoro group, and Z are optional repeat units containing pendant alkyl, aryl, alkylaryl or imide groups. Examples of Z as a monomer are styrene, benzyl mathacrylate, maleimide, butyl methacrylate, 2-ethylhexyl methacrylate, etc. Furthermore, in structure (10) a, b and c depict the mole % of type of repeat unit and (a) ranges from 10 to 40%, (b) ranges from 10-50% and (c) ranges from 0-30%.

Examples of unit X are

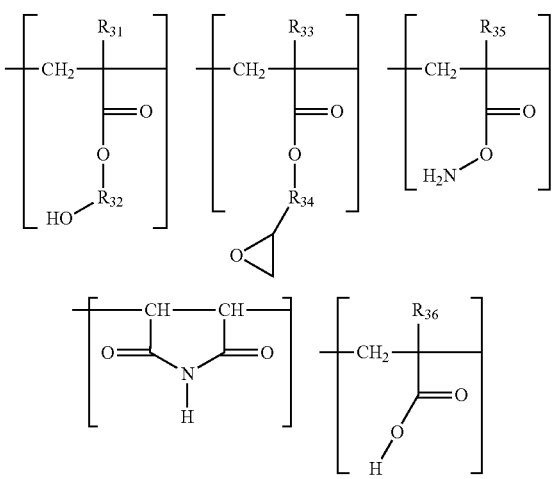

Examples of Y are

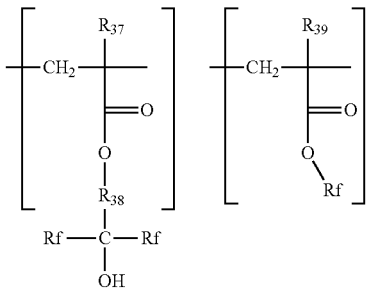

Examples of Z are

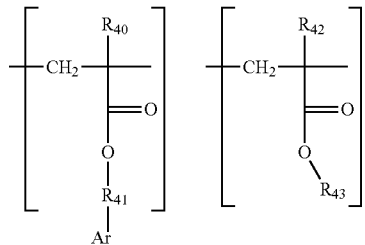

where, R$_{31}$, R$_{33}$, R$_{35}$, R$_{36}$, R$_{37}$, R$_{39}$, R$_{40}$ and R$_{42}$ are chosen independently from the group consisting of H, and C$_1$-C$_4$ alkyl; R$_{32}$, R$_{34}$, R$_{38}$, and R$_{41}$ are independently C$_1$-C$_8$ alkylene spacers, R$_{43}$ is a C$_1$-C$_{12}$ alkyl group; R$_f$ is a fully fluorinated or partially fluorinated C$_1$-C$_4$ group; Ar is an aromatic group such as phenyl, alkylsubstituted phenyl, naphthyl and alkyl substituted naphthyl and the like.

Specific examples of the acrylate copolymers are
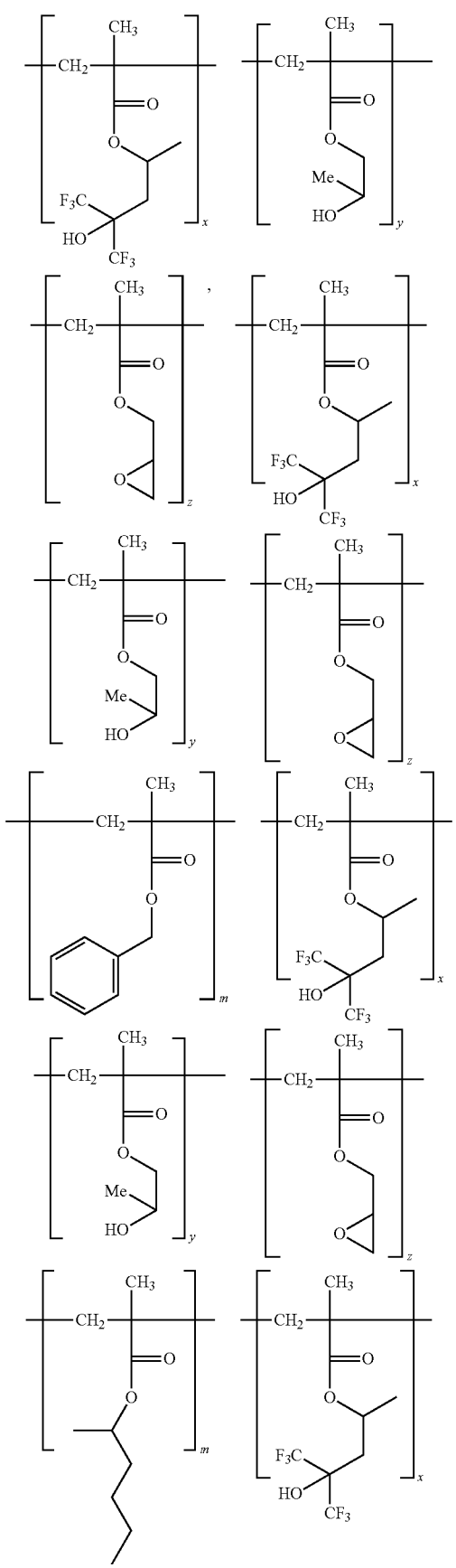
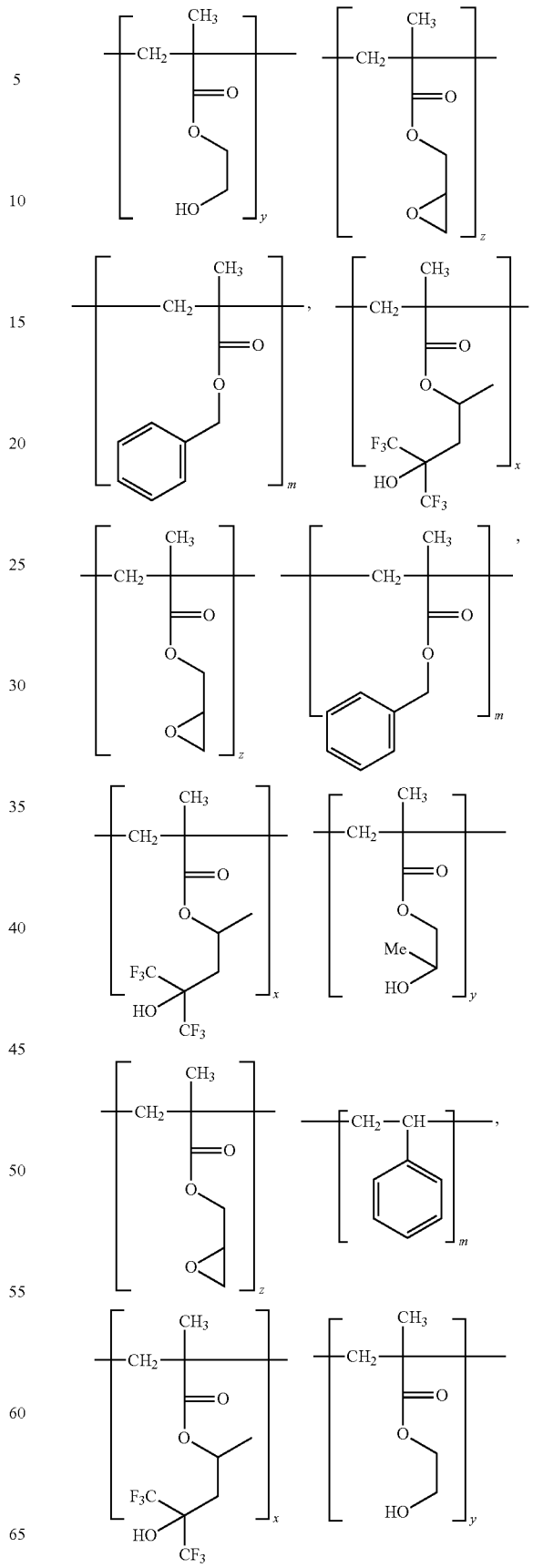

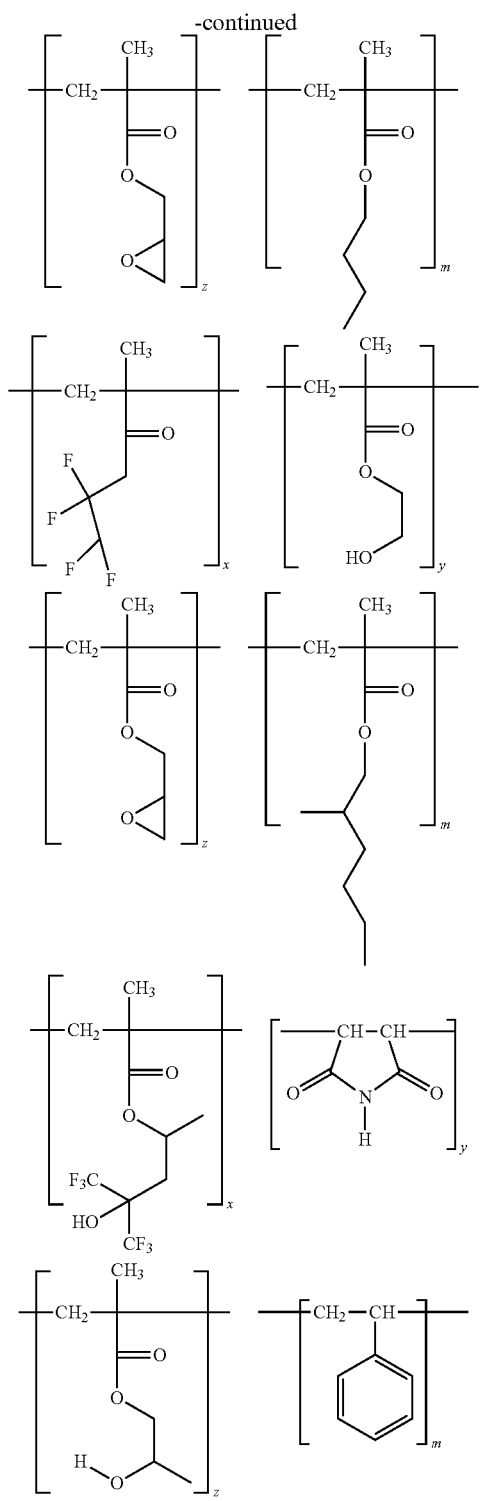

where x=10-50 mole %, y=0-40 mole %, z=0-40 mole %, y+z=20-60 mole %, m=0-30 mole %.

The term "alkyl" as used herein means a straight, branched or cyclic chain hydrocarbon. Representative examples of alkyl include, but are not limited to, methyl, ethyl, n-propyl, iso-propyl, n-butyl, sec-butyl, iso-butyl, tert-butyl, n-pentyl, isopentyl, neopentyl, n-hexyl, 3-methylhexyl, 2,2-dimethylpentyl, 2,3-dimethylpentyl, n-heptyl, n-octyl, n-nonyl, and n-decyl. Alkyl may also refer to alkyl groups that comprise an unsaturated double or triple bond, but are nonaromatic. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein. Unless otherwise stated, alkyl refers to 1-10 carbon atom moieties.

Alkylene groups are divalent alkyl groups derived from any of the alkyl groups mentioned hereinabove. When referring to alkylene groups, these include an alkylene chain substituted with ($C_1$-$C_6$)alkyl groups in the main carbon chain of the alkylene group. Alkylene groups can also include one or more alkene or alkyne groups in the alkylene moiety, where alkene and alkyne refers to a double and triple bond respectively. Essentially an alkylene is a divalent hydrocarbon group as the backbone. Accordingly, a divalent acyclic group may be methylene, 1,1- or 1,2-ethylene, 1,1-, 1,2-, or 1,3propylene, 2,5-dimethyl-hexene, 2,5-dimethyl-hex-3-yne, and so on. Similarly, a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above. A particularly useful tricyclic alkyl group in this invention is 4,8-bis(methylene)-tricyclo[$5.2.1.0.^{2,6}$]decane. Unless otherwise stated, alkyl refers to 1-10 carbon atom moiety.

The term "aryl" as used herein means a radical derived from an aromatic hydrocarbon by the elimination of one atom of hydrogen and can be substituted or unsubstituted. Arylene is a divalent aromatic radical. A polycyclic aromatic ring is such as biphenyl, substituted biphenyl, anthracene, substituted anthracene, halogenated anthracene, pyrene, substituted pyrene, phenanthrene, substituted phenanthrene and the like. The polycyclic aromatic ring has at least two aromatic rings directly bonded or fused which is attached to the polymer backbone through one or more bonds, part of the backbone through two or more bonds, or present as a non-bonded additive in an antireflective formulation.

As used herein, the term "alkoxy" refers to a group of alkyl-O—, where alkyl is defined herein. Representative examples of alkoxy include, but are not limited to, methoxy, ethoxy, propoxy, 2-propoxy, butoxy, tert-butoxy, pentyloxy, and hexyloxy. The term aryloxy, as used herein means to a group of aryl-O—, where aryl is defined herein.

The novel composition of the present invention further comprises a thermal acid generator (TAG). A thermal acid generator may be a thermal acid generator capable of generating a strong acid upon heating. The thermal acid generator (TAG) used in the present invention may be any one or more TAGs that upon heating generates an acid which can react with the crosslinkable components and propagate crosslinking of the components present in the invention, particularly preferred is a strong acid such as a sulfonic acid. Non limiting examples of general classes of TAG materials include triarylsulfonium salts, aryldialkylsulfonium salts, dialkylarylsulfonium salts diaryliodonium salts, tosylates, derivatives of benzene sulfonic acid salts, alkylammonium and ammonium salts of fluoroakylsulfonic acid, and derivatives of naphthalene sulfonic acid salts. Specific examples of TAG components include the following: metal-free sulfonium salts and iodonium salts, such as triarylsulfonium, dialkylarylsulfonium, and diarylalkylsulfonium salts of strong non-nucleophilic acids, alkylaryliodonium, diaryliodonium salts of strong non-nucleophilic acids; and ammonium, alkylammonium, dialkylammonium, trialkylammonium, tetraalkylammonium salts of strong non nucleophilic acids. Covalent thermal acid generators also are envisaged as useful additives, for instance 2-nitrobenzyl esters of alkyl or arylsulfonic acids and other esters of sulfonic acid which thermally decompose to give free sulfonic acids. Examples include diaryliodonium perfluoroalkylsulfonates, diaryliodonium tris(fluoroalkylsulfonyl)methide, diaryliodonium bis(fluoroalkylsulfonyl)methide, diarlyliodonium bis(fluoroalkylsulfonyl)imide, diaryliodonium quaternary ammonium perfluoroalkylsulfonate. Examples of labile esters include 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; quaternary ammonium tris(fluoroalkylsulfonyl)methide, and quaternaryalkyl ammonium bis(fluoroalkylsulfonyl)imide, alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including, those disclosed in U.S. Pat. No. 3,474,054, U.S. Pat. No. 4,200,729, U.S. Pat. No. 4,251,665 and U.S. Pat. No. 5,187,019. Preferably the TAG will have a very low volatility at temperatures between 170-220° C. Examples of TAGs are those sold by King Industries under Nacure and CDX names. Such TAGs are Nacure 5225, and CDX-2168E, which is a dodecylbenzene sulfonic acid amine salt supplied at 25-30% activity in propylene glycol methyl ether from King Industries, Norwalk, Conn. 06852, USA. Another TAG may be amine salt of 1-nonafluorobutane sulfonic acid, or p-toluenesulfonic acid. Typically, a thermal acid generator is present in an antireflective compound in a concentration of from about 0.1 to about 10% by weight, from about 0.1 to 7.0 percent weight total of the dry components of the composition, or from about 0.1 to 5.0 percent weight total of the dry components of the composition.

The novel composition may further comprise a crosslinker additive present at a concentration of 3 to 25 wt % of total solids. A crosslinker is present which may be monomeric, oligomeric or polymeric. A variety of crosslinker or crosslinking agents can be used in the composition of the present invention as optional components. Any suitable crosslinking agents that can crosslink the polymer in the presence of an acid may be used. Examples, without limitation, of such crosslinking agents are resins containing melamines, methylols, glycoluril, polymeric glycolurils, benzoguanamine, urea, hydroxy alkyl amides, epoxy and epoxy amine resins, blocked isocyanates, and divinyl monomers. Monomeric melamines like hexamethoxymethyl melamine; glycolurils like tetrakis(methoxymethyl)glycoluril; and aromatic methylols, like 2,6bishydroxymethyl p-cresol may be used. Typically, the crosslinker polymer is a compound that can act as an electrophile and can, alone or in the presence of an acid, form a carbocation. Thus, compounds containing groups such as alcohol, ether, ester, olefin, methoxymethylamino, methoxymethylphenyl and other molecules containing multiple electrophilic sites, are capable of crosslinking. The crosslinker polymer is capable of self crosslinking. Polymeric crosslinkers, such as polymers of glycoluril and polyols, may also be used. A crosslinker may be selected from, but not limited to, melamines, methylols, glycolurils, polymeric glycolurils, hydroxy alkyl amides, epoxy and epoxy amine resins, blocked isocyanates, polymeric crosslinkers, and divinyl monomers. Crosslinking agents disclosed in US 2006/0058468 and incorporated herein by reference, where the crosslinking agent is a polymer obtained by reacting at least one glycoluril compound with at least one reactive compound containing at least one hydroxy group and/or at least one acid group may be used.

The solid components of the present invention are dissolved in a solvent or mixture of solvents. The solvents may be chosen from alcohols, esters, glymes, ethers, glycol ethers, glycol ether esters, ketones, lactones, cyclic ketones and mixtures thereof. Examples of such solvents include, but are not limited to, propylene glycol methyl ether (PGME), propylene glycol methyl ether acetate (PGMEA), cyclohexanone, 2-heptanone, ethyl 3-ethoxy-propionate, ethyl lactate, gamma valerolactone, methyl 3-methoxypropionate, methyl α-hydroxyisobutyrate and mixtures thereof. The solvent is typically present in an amount of from about 40 to about 99 weight percent.

The n and k values can be calculated using an ellipsometer, such as the J. A. Woollam WVASE VU-302™ Ellipsometer. The exact values of the optimum ranges for k and n are dependent on the exposure wavelength used and the type of application. Typically for 193 nm the preferred range for k for the novel composition is 0.05 to 0.3 or 0.1 to 0.25 or 0.1 to 0.2, for 248 nm the preferred range for k is 0.05 to 0.3 or 0.1 to 0.25 or 0.1 to 0.2. The antireflective coating composition of claim 1, wherein the refractive index value of the composition is optimized at 193 nm to be less than 1.65, less than 1.6, less than 1.55, less than 1.5, less than 1.45, less than 1.4, less than 1.35 or greater than 1.3.

Furthermore, the process of this invention comprises where the photoresist is image-wise exposed at wavelengths between 10 nm to 250 nm and more specifically the photoresist is image-wise exposed at a wavelength of 193 nm.

The novel antireflective coating composition is coated on the substrate using techniques well known to those skilled in the art, such as spin coating, dipping or spraying. The film thickness ranges from about 0.005 micron to about 1 micron. Thicker antireflective coatings, up to 10 microns, may be used for planarization of substrates with topography. The antireflective coating is further heated on a hot plate or convection oven to remove any residual solvent and to render insoluble the antireflective film.

The photoresist coated over the antireflective coating can be any type used in the semiconductor industry, provided that the photoactive compound in the photoresist and the antireflective coating substantially absorb at the exposure wavelength used for the imaging process. The photoresist may use various techniques to provide imagewise exposure, such as radiation in the range of 450 nm to 10 nm, which include 248 nm, 193 nm and 13.4 nm.

Positive tone and negative tone photoresists may be used. Photoresist resolution is defined as the smallest feature which the photoresist composition can transfer from the photomask to the substrate with a high degree of image edge acuity after exposure and development. In many manufacturing applications today, photoresist resolution on the order of less than one micron are necessary. In addition, it is almost always desirable that the developed photoresist wall profiles be near vertical relative to the substrate. Such demarcations between developed and undeveloped areas of the photoresist coating translate into accurate pattern transfer of the mask image onto the substrate. This becomes even more critical as the drive toward miniaturization reduces the critical dimensions on the devices. Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. The sensitivity of these types of photoresists typically ranges from about 300 nm to 440 nm.

High resolution, chemically amplified, deep ultraviolet (100-300 nm) positive and negative tone photoresists are available for patterning images with less than quarter micron geometries. There are two major deep ultraviolet (uv) exposure technologies that have provided significant advancement in miniaturization, and these are lasers that emit radiation at 248 nm and 193 nm. Examples of such photoresists are given in the following patents and incorporated herein by reference, U.S. Pat. No. 4,491,628, U.S. Pat. No. 5,350,660, U.S. Pat. No. 5,843,624, U.S. Pat. No. 5,998,099, and U.S. Pat. No. 6,132,926. Photoresists for 248 nm have typically been based on substituted polyhydroxystyrene and its copolymers. On the other hand, photoresists for 193 nm exposure require non-aromatic polymers, since aromatics are opaque at this wavelength. Generally, alicyclic hydrocarbons are incorporated into the polymer to replace the etch resistance lost by eliminating the aromatic functionality. Furthermore, at lower wavelengths the reflection from the substrate becomes increasingly detrimental to the lithographic performance of the photoresist. Therefore, at these wavelengths antireflective coatings become critical. The present composition is particularly useful for euv or 193 nm or 248 nm imaging.

The process of the instant invention further comprises coating a substrate with a novel antireflective coating composition, followed by heating on a hotplate or convection oven at a sufficiently high temperature for sufficient length of time to insolubilize the coating so as not to be soluble in the coating solvent of the photoresist or in the aqueous alkaline developer used to develop the photoresist. Various substrates known in the art may be used, such as those that are planar, have topography or have holes. The range of temperature is from about 70° C. to about 250° C., or from about 130° C. to about 225° C. If the temperature is below 70° C. then insufficient loss of solvent or insufficient degree of insolubilization takes place and at temperatures above 250° C. the polymer may become chemically unstable. The antireflective coating of this invention may be baked at temperatures greater than 90° C. The exact temperature to be used is determined by the specific application. A film of a photosensitive material (photoresist) is then coated on top of the antireflective coating and baked to substantially remove the photoresist solvent. The photoresist is image-wise exposed and developed in an aqueous developer to remove the treated photoresist. An optional heating step can be incorporated into the process prior to development and after exposure. The process of coating and imaging photoresists is well known to those skilled in the art and is optimized for the specific type of photoresist used. The patterned substrate is then dry etched. The etching may be carried out in a suitable etch chamber to remove the exposed portions of the antireflective film, with the remaining photoresist acting as an etch mask. The present invention also provides methods of using said compositions as antireflective coatings for substrates in immersion lithography processes, wherein a high etch rate is achieved using the provided antireflective compositions. Optional heating steps may be included to optimize the etching process. Various etching techniques known in the art may be used.

After the coating process, the photoresist is image-wise exposed. The exposure may be done using typical exposure equipment. The exposed photoresist is then developed in an aqueous developer to remove the treated photoresist. The developer is preferably an aqueous alkaline solution comprising, for example, tetramethyl ammonium hydroxide (TMAH). The developer may further comprise surfactant(s). The developer may be a 2.38 weight % TMAH aqueous solution. The development time may be 60 seconds. An optional heating step can be incorporated into the process prior to development and after exposure.

The process of coating and imaging photoresists is well known to those skilled in the art and is optimized for the specific type of photoresist used. The patterned substrate can then be dry etched with an etching gas or mixture of gases, in a suitable etch chamber to remove the exposed portions of the antireflective film or multiple layers of antireflective coatings, with the remaining photoresist acting as an etch mask. Various etching gases are known in the art for etching organic antireflective coatings, such as those comprising $O_2$, $CF_4$, $CHF_3$, $Cl_2$, HBr, $SO_2$, CO, etc.

Each of the documents referred to above is incorporated herein by reference in its entirety, for all purposes. The following specific examples will provide detailed illustrations of the methods of producing antireflective compositions of the present invention, the methods of use of the provided compositions to formulate antireflective coatings, and methods of using the provided antireflective coatings in image formation on photoresists. These examples are not intended, however, to limit or restrict the scope of the invention in any way and should not be construed as providing conditions, parameters or values which must be utilized exclusively in order to practice the present invention.

EXAMPLES

Synthesis Examples 1

30 grams of poly(melamine-co-formaldehyde) methylated (MW=511), 4.5 grams of 1-acetyl-2,4-dihydroxybenzene, 70 grams of PGMEA were charged into a flask with a thermometer, mechanical stirrer and a cold water condenser. After a catalytic amount of para-toluenesulfonic acid monohydrate (0.35 g) was added, the reaction was maintained at 85° C. for 18 hrs. The reaction solution was then cooled to room temperature and filtered. The filtrate was slowly poured into distilled water while stirring to precipitate the polymer. The polymer was collected by filtration. After drying, the polymer was re-dissolved in tetrahydrofuran (THF) and precipitated in water. The polymer was filtered, washed thoroughly with water and dried in a vacuum oven. 27 g of polymer product was obtained with a weight average molecular weight of about 3,600 g/mol.

Synthesis Examples 2

30 grams of poly(melamine-co-formaldehyde) methylated (MW=511), 6.4 grams of diethyl bis(hydroxymethyl)malonate, 80 grams of PGMEA were charged into a flask with a thermometer, mechanical stirrer and a cold water condenser. After a catalytic amount of para-toluenesulfonic acid monohydrate (0.3 g) was added, the reaction was maintained at 85° C. for 18 hrs. The reaction solution was then cooled to room temperature and filtered. The filtrate was slowly poured into distilled water while stirring to precipitate the polymer. The polymer was collected by filtration. After drying, the polymer was re-dissolved in THF and precipitated in water. The polymer was filtered, washed thoroughly with water and dried in a vacuum oven. 29 g of polymer product was obtained with a weight average molecular weight of about 6,800 g/mol.

Synthesis Examples 3

20 grams of tetramethoxymethyl glycoluril, 8.5 grams of neopentyl glycol, 3.5 grams of 3,4,5-trimethoxyphenol, 30 g of THF and 40 grams of PGMEA were charged into a flask with a thermometer, mechanical stirrer and a cold water condenser. After a catalytic amount of para-toluenesulfonic acid monohydrate (0.35 g) was added, the reaction was maintained at 80° C. for 5.5 hrs. The reaction solution was then cooled to room temperature and filtered. The filtrate was slowly poured into distilled water while stirring to precipitate the polymer. The polymer was collected by filtration. After drying, the polymer was re-dissolved in THF and precipitated in water. The polymer was filtered, washed thoroughly with water and dried in a vacuum oven. 14.0 g of polymer product was obtained with a weight average molecular weight of about 3500 g/mol.

Synthesis Examples 4

20 grams of tetramethoxymethyl glycoluril, 15 grams of diethyl bis(hydroxymethyl)malonate, 4.5 grams of 3,4,5-trimethoxyphenol, 30 g of THF and 50 grams of PGMEA were charged into a flask with a thermometer, mechanical stirrer and a cold water condenser. After a catalytic amount of para-toluenesulfonic acid monohydrate (0.4 g) was added, the reaction was maintained at 80° C. for 7.5 hrs. The reaction solution was then cooled to room temperature and filtered. The filtrate was slowly poured into distilled water while stirring to precipitate the polymer. The polymer was collected by filtration. After drying, the polymer was re-dissolved in THF and precipitated in water. The polymer was filtered, washed thoroughly with water and dried in a vacuum oven. 24.0 g of polymer product was obtained with a weight average molecular weight of about 6000 g/mol.

Synthesis Examples 5

500 grams of 1,2,4,5-benzenetetracarboxylic dianhydride, 174 grams of ethylene glycol and 1214 grams of acetonitrile were charged in a 5-L flask. The mixture was heated to 85° C. under low nitrogen flow and the reaction was allowed to mix for 22 h. The mixture was cooled down to about 40° C. 1300 grams of propylene oxide and 13 grams of benzyltriethylammonium chloride were added slowly to the flask. The reaction mixture was allowed to reflux at 55° C. for 24 h. After cooling down, the solution was filtered and precipitated in water. The solid was collected and dried. The crude product was re-dissolved in acetonitrile and precipitated in water. The white powder was dried under nitrogen and dried under vacuo at 40° C. 580 grams of polymer were obtained with an average molecular weight of 30000 g/mol.

Synthesis Example 6

9.7 g of isopropyl hexafluoroisopropanol methacrylate (MA-BTHB-OH), 5.9 g of 2-ethylhexyl methacrylate, 3.5 g of 2-hydroxyethyl methacrylate and 8.5 g of glycidyl methacrylate, were mixed in 120 g of THF solvent. The polymerization reaction took place in the presence of 1.0 g of AIBN at reflux 70° C. under nitrogen for 20 hrs. After cooling down to room temperature, the reaction mixture was precipitated in DI water. The white polymer solid was washed and dried under vacuum at 45° C. with a yield of 27.2 g (99%). The Mw of the polymer measured by GPC was 19,100.

Synthesis Example 7

9.7 g of MA-BTHB-OH, 5.8 g of benzyl methacrylate, 5.1 g of 2-hydroxyethyl methacrylate and 6.4 g of glycidyl methacrylate, were mixed in 120 g of tetrahydrofuran (THF) solvent. The polymerization reaction took place in the presence of 1.0 g of AIBN at reflux 70° C. under nitrogen for 20 hrs. After cooling down to room temperature, the reaction mixture was precipitated in DI water. The white polymer solid was washed and dried under vacuum at 45° C. with a yield of 26.5 g (99%). The $M_W$ of polymer measured by GPC was 19,000.

Synthesis Example 8

15.0 g of MA-BTHB-OH, 6.0 g of styrene, 10.0 g of 2-hydroxypropyl methacrylate and 19.0 g of glycidyl methacrylate, were mixed in 200 g of propylene glycol monomethyl ether acetate (PGMEA) solvent. The polymerization reaction took place in the presence of 0.97 g of AIBN at reflux 70° C. under nitrogen for 24 h. After cooling down to room temperature, the reaction mixture was precipitated in DI water. The white polymer solid was washed and dried under vacuum at 45° C. with a yield of 50.0 g (>99%). The $M_w$ of polymer measured by GPC was 18,500.

Synthesis Example 9

9.7 g of MA-BTHB-OH, 5.7 g of benzyl methacrylate, 6.5 g of 2-hydroxypropyl methacrylate and 5.1 g of 2-hydroxyethyl methacrylate were mixed in 120 g of THF solvent. The polymerization reaction took place in the presence of 1.0 g of AIBN at reflux 70° C. under nitrogen for 18 h. After cooling down to room temperature, the reaction mixture was precipitated in DI water. The white polymer solid was washed and dried under vacuum at 45° C. with a yield of 26.5 g (98%). The $M_W$ of polymer measured by GPC was 18,000.

Synthesis Example 10

18.5 g of MA-BTHB-OH, 3.5 g of 2-hydroxyethyl methacrylate and 8.5 g of glycidyl methacrylate, were mixed in 120 g of THF solvent. The polymerization reaction was allowed in the presence of 1.0 g of AIBN at reflux 70° C. under nitrogen for 20 hrs. After cooling down to room temperature, the reaction mixture was precipitated in DI water. The white polymer solid was washed and dried under vacuum at 45° C. with a yield of 29.8 g (99%).

Synthesis Example 11

20.0 g of Isopropyl hexafluoroisopropanol methacrylate (MA-BTHB-OH), 4.1 g of maleimide, 6.0 g of hydroxyproryl methacrylate and 1.8 g of styrene were mixed in 120 g of THF solvent. The polymerization reaction took place in the presence of 0.7 g of AIBN at 75° C. under nitrogen for 20 h. After cooling down to room temperature, the reaction mixture was precipitated in DI water. The white polymer solid was washed and dried in vacuo at 45° C. yielding 29.7 g (93%) with an average MW of 20000.

Synthesis Example 12

7.4 g of 2,2,3,3,3-Pentafluoropropyl Methacrylate, 4.3 g of Benzyl methacrylate, 3.6 g of glycidyl methacrylate, 2.2 g of hydroxyproryl methacrylate and 1.0 g of methyl methacrylate were mixed with in 80 g of PGME solvent. The polymerization reaction was allowed in the presence of 0.33 g of AIBN at 75° C. under nitrogen for 18 h. After cooling down to room temperature, the reaction mixture was precipitated in DI water. The white polymer solid was washed and dried in vacuo at 45° C. yielding 18 g (97%).

Comparative Synthesis Example 1

20.32 g of Anthracenylmethyl methacrylate, 23.32 g of 2-Hydroxypropylmethacrylate, 1.58 g of acetoacetoxyethylmethacrylate, 1.05 g of n-butylmethacrylate and 210 g of PGMEA are added in a 500 ml flask. The polymerization reaction took place in the presence of 1.4 g of AIBN with reflux at 90° C. under nitrogen for 20 hrs. After cooling down to room temperature, the reaction mixture was precipitated in hexane. The white polymer solid was washed and dried under vacuum at 45° C. with a yield of 44.0 g (95%). The Mw of the polymer measured by GPC was 16,000.

Formulation and Coating Example 1

0.8 g polymer from Synthesis Example 3 and 0.2 g of product from Synthesis Example 5 and 0.05 g of poly (melamine-co-formaldehyde) methylated (Aldrich, MW=511) was dissolved in 40 g of PGMEA/PGME 70/30 solvent to make a 2.5 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 μm. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.60 and the extinction coefficient "k" was 0.19.

Formulation and Coating Example 2

0.8 g polymer from Synthesis Example 4 and 0.2 g of product from Synthesis Example 5 and 0.05 g of poly (melamine-co-formaldehyde) methylated (Aldrich, MW=511) was dissolved in 40 g of PGMEA/PGME 70/30 solvent to make a 2.5 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 μm. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.59 and the extinction coefficient "k" was 0.19.

Formulation and Coating Example 3

0.8 g polymer from Synthesis Example 4 and 0.2 g of product from Synthesis Example 2 was dissolved in 40 g of PGMEA/PGME 70/30 solvent to make a 2.5 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 μm. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.59 and the extinction coefficient "k" was 0.14.

Formulation and Coating Example 4

0.8 g polymer from Synthesis Example 4 and 0.2 g of product from Synthesis Example 5 was dissolved in 40 g of PGMEA/PGME 70/30 solvent to make a 2.5 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 μm. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.60 and the extinction coefficient "k" was 0.20.

Formulation and Coating Example 5

1 g polymer from Synthesis Example 1 was dissolved in 40 g of PGMEA/PGME 70/30 solvent to make a 2.5 wt % solution. The polymer solution then was filtered through a micro filter with a pore size of 0.2 μm. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.34 and the extinction coefficient "k" was 0.22.

Formulation and Coating Example 6

1 g polymer from Synthesis Example 1 was dissolved in 40 g of PGMEA/PGME 70/30 solvent to make a 2.5 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 μm. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.34 and the extinction coefficient "k" was 0.23.

Formulation and Coating Example 7

1 g polymer from Synthesis Example 2 was dissolved in 40 g of PGMEA/PGME 70/30 solvent to make a 2.5 wt % solution. 0.1 g of 10% of dodecylbenzene sulfonic acid triethylamine salt was added in the polymer solution. The mixture then was filtered through a micro filter with a pore size of 0.2 μm. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.39 and the extinction coefficient "k" was 0.12.

Formulation and Coating Example 8

0.85 g polymer from Synthesis Example 2 and 0.15 g of product from Synthesis Example 7 was dissolved in 40 g of PGMEA/PGME 70/30 solvent to make a 2.5 wt % solution. 0.05 g of 10% of dodecylbenzene sulfonic acid triethylamine salt, 0.1 g of 10% of 1-nonafluorobutane sulfonic acid triethylamine salt and 0.2 g of 10% of TPSNf in PGMEA/PGME 70/30 was added in the polymer solution. The mixture then was filtered through a micro filter with a pore size of 0.2 μm. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.46 and the extinction coefficient "k" was 0.15.

Formulation and Coating Example 9

0.8 g polymer from Synthesis Example 2 and 0.2 g of product from Synthesis Example 5 was dissolved in 40 g of PGMEA/PGME 70/30 solvent to make a 2.5 wt % solution. 0.05 g of 10% of dodecylbenzene sulfonic acid triethylamine salt, 0.1 g of 10% of 1-nonafluorobutane sulfonic acid triethylamine salt and 0.2 g of 10% of TPSNf in PGMEA/PGME 70/30 was added in the polymer solution. The mixture then was filtered through a micro filter with a pore size of 0.2 μm. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.38 and the extinction coefficient "k" was 0.19.

Formulation and Coating Example 10

0.7 g polymer from Synthesis Example 2 and 0.3 g of product from Synthesis Example 7 was dissolved in 40 g of PGMEA/PGME 70/30 solvent to make a 2.5 wt % solution. 0.1 g of 10% of dodecylbenzene sulfonic acid triethylamine salt in PGMEA/PGME 70/30 was added in the polymer solution. The mixture then was filtered through a micro filter with a pore size of 0.2 μm. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.46 and the extinction coefficient "k" was 0.08.

Formulation and Coating Example 11

0.7 g polymer from Synthesis Example 2 and 0.3 g of product from Synthesis Example 11 was dissolved in 40 g of PGMEA/PGME 70/30 solvent to make a 2.5 wt % solution. 0.1 g of 10% of dodecylbenzene sulfonic acid triethylamine salt and 0.05 g of 10% of 1-nonafluorobutane sulfonic acid triethylamine salt in PGMEA/PGME 70/30 was added in the polymer solution. The mixture then was filtered through a micro filter with a pore size of 0.2 μm. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.45 and the extinction coefficient "k" was 0.15.

Formulation and Coating Example 12

0.85 g polymer from Synthesis Example 2 and 0.15 g of product from Synthesis Example 9 was dissolved in 40 g of PGMEA/PGME 70/30 solvent to make a 2.5 wt % solution. 0.05 g of 10% of dodecylbenzene sulfonic acid triethylamine salt and 0.1 g of 10% of 1-nonafluorobutane sulfonic acid triethylamine salt in PGMEA/PGME 70/30 was added in the polymer solution. The mixture then was filtered through a micro filter with a pore size of 0.2 μm. The solution was then spun coated on a silicon wafer for 40 seconds. The coated wafer was then heated on a hot plate for 1 minute at 200° C. The anti-reflective coating was analyzed on a spectroscopic ellipsometer. The optimized refractive index "n" at 193 nm was 1.45 and the extinction coefficient "k" was 0.15.

Comparative Formulation and Coating Example 1 g polymer from Comparative Synthesis Example 1 was dissolved in 40 g of PGMEA/PGME 70/30 solvent to make a 2.5 wt % solution. 0.2 g of Cymel®301 crosslinker and 0.1 g of 10% of dodecylbenzene sulfonic acid triethylamine salt in PGMEA/PGME 70/30 was added in the polymer solution. The mixture then was filtered through a micro filter with a pore size of 0.2 um. The solution was then spun coated on a silicon wafer for 40 seconds. The coated wafer was then heated on a hot plate for 1 minute at 200° C. The anti-reflective coating was analyzed on a spectroscopic ellipsometer. The optimized reflective index "n" at 193 nm was 1.53 and the absorption parameter "k" was 0.16.

Comparison of Etch Rate for Coatings Prepared Based on Coating Example 8 And Comparative Coating Example 10.0 wt % formulation solution for Coating Example 8 and 10.0 wt % formulation solution for Comparative Coating Example were prepared for etch rate tests. The coated wafer was then heated on a hot plate for 1 minute at 200° C. AZ®2110P (available from AZ Electronic Materials USA Corp, 70 Meister Ave., Somerville, N.J.) photoresist baked for 1 minute at 100° C. was used as reference. All experiments were carried out without patterned photoresist on top. The etch rates of various materials were measured using the conditions summarized in the following Table 1.

TABLE 1

| Instrument | Nordson March RIE-1701 |
|---|---|
| POWER | 500 W |
| Gas Flow | CF4 = 20 sccm |
| Base Pressure | 50 mT |
| Process Pressure | 125 mT |
| Etching Time | 20 sec |

The etch rate results are listed in Table 2. The ratio of the antireflective coating (ARC)/Photoresist etch rate shows that the Coating Example 8 is 1.54 times faster than the photoresist etch rate, and the Comparative Coating Example gave an etch rate similar to the photoresist etch rate.

TABLE 2

| Materials | Etch rate (Å/s) | Ratio of ARC/PhotoResist Etch rate |
|---|---|---|
| AZ ®2110P resist | 26.0 | 1.0 |
| Coating Example 8 (10%) | 40.0 | 1.54 |
| Comp. Coating Example (10%) | 25.5 | 0.98 |

Lithography Performances Example 1

The performance of the anti-reflective coating formulation from Formulation and Coating Example 3 was evaluated using AZ® 2110P photoresist (product of AZ Electronic Materials USA Corp., Somerville, N.J.). A silicon wafer was coated with AZ® EB18B bottom antireflective coating composition (AZ Electronic Materials USA Corp., Somerville, N.J.) and baked at 220° C. for 60 seconds to form a 65 nm thick film. Then a 40 nm thick film of Formulation and Coating Example 3 was spin-coated over and baked at 205° C. for 60 seconds. Then a 190 nm thick AZ® 2110P photoresist solution was coated and baked at 100° C. for 60 seconds. The wafer was then image-wise exposed using a Nikon NSR-306D 193 nm scanner with 0.85 NA, under dipole Y illumination of 0.9 sigma with a PSM mask. The exposed wafer was baked at 110° C. for 60 seconds and developed in AZ® 300 MIF developer (available from AZ Electronic Materials USA Corp., Somerville, N.J.) for 30 seconds. The cleaned wafer was then examined under scanning electron microscope. Line and space patterns at 80 nm L/S 1:1 with a photo speed of 44 mJ/cm² showed no standing waves, no footing and no scumming, indicating efficacy of the bottom anti-reflective coating.

Lithography Performances Example 2

The performance of the anti-reflective coating formulation from Formulation and Coating Example 8 was evaluated using AZ® 2110P photoresist (product of AZ Electronic Materials USA Corp., Somerville, N.J.). A silicon wafer was coated with AZ® EB18B bottom antireflective coating composition (AZ Electronic Materials USA Corp., Somerville, N.J.) and baked at 220° C. for 60 seconds to form a 65 nm thick film. Then a 53 nm thick film of Formulation and Coating Example 8 was spin-coated over and baked at 200° C. for 60 seconds. Then a 190 nm thick AZ® 2110P photoresist solution was coated and baked at 100° C. for 60 seconds. The wafer was then image-wise exposed using a Nikon NSR-306D 193 nm scanner with 0.85 NA, under dipole Y illumination of 0.9 sigma with a PSM mask. The exposed wafer was baked at 110° C. for 60 seconds and developed in AZ® 300 MIF developer (available from AZ Electronic Materials USA Corp., Somerville, N.J.) for 60 seconds. The cleaned wafer was then examined under scanning electron microscope. Line and space patterns at 80 nm L/S 1:1 with a photo speed of 40 mJ/cm² showed no standing waves, no footing and no scumming, indicating efficacy of the bottom anti-reflective coating.

Lithography Performances Example 3

The performance of the anti-reflective coating formulation from Formulation and Coating Example 12 was evaluated using AZ® 2110P photoresist (product of AZ Electronic Materials USA Corp., Somerville, N.J.). A silicon wafer was coated with AZ® EB18B bottom antireflective coating composition (AZ Electronic Materials USA Corp., Somerville, N.J.) and baked at 220° C. for 60 seconds to form a 65 nm thick film. Then a 53 nm thick film of Formulation and Coating Example 12 was spin-coated over and baked at 200° C. for 60 seconds. Then a 190 nm thick AZ® 2110P photoresist solution was coated and baked at 100° C. for 60 seconds. The wafer was then image-wise exposed using a Nikon NSR-306D 193 nm scanner with 0.85 NA, under dipole Y illumination of 0.9 sigma with a PSM mask. The exposed wafer was baked at 110° C. for 60 seconds and developed in AZ® 300 MIF developer (available from AZ Electronic Materials USA Corp., Somerville, N.J.) for 60 seconds. The cleaned wafer was then examined under scanning electron microscope. Line and space patterns at 80 nm L/S 1:1 with a photo speed of 40 mJ/cm² showed no standing waves, no footing and no scumming, indicating efficacy of the bottom anti-reflective coating.

Lithography Performances Example 4

The performance of the anti-reflective coating formulation from Formulation and Coating Example 4 was evaluated using AZ® 2110P photoresist (product of AZ Electronic Materials USA Corp., Somerville, N.J.). A silicon wafer was coated with AZ® EB18B bottom antireflective coating composition (AZ Electronic Materials USA Corp., Somerville, N.J.) and baked at 220° C. for 60 seconds to form a 65 nm thick film. Then a 38 nm thick film of Formulation and Coating Example 4 after dilution was coated over and baked at 205° C. for 60 seconds. Then a 190 nm thick AZ® 2110P photoresist solution was coated and baked at 100° C. for 60 seconds. The wafer was then image-wise exposed using a Nikon NSR-306D 193 nm scanner with 0.85 NA, under dipole Y illumination of 0.9 sigma with a PSM mask. The exposed wafer was baked at 110° C. for 60 seconds and developed in AZ® 300 MIF developer (available from AZ Electronic Materials USA Corp., Somerville, N.J.) for 30 seconds. The cleaned wafer was then examined under scanning electron microscope. Line and space patterns at 80 nm L/S 1:1 with a photo speed of 44 mJ/cm² showed no standing waves, no footing and no scumming, indicating efficacy of the bottom anti-reflective coating.

What is claimed is:

1. An antireflective coating composition comprising
   a) a polymer obtained from a reaction product of at least one amino compound chosen from the group consisting of a polymer with a repeat unit of structure (1) reacted with a hydroxy compound of structure (3) and,
   b) a thermal acid generator,

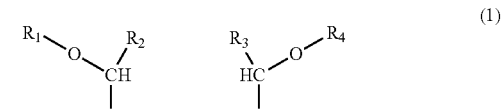

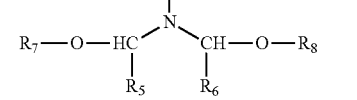

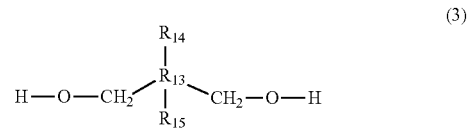

wherein $R_1$, $R_2$, $R_3$, $R_4$, $R_5$, $R_6$, $R_7$, $R_8$ are independently H or a $C_1$-$C_4$ alkyl group; $R_{13}$ is a direct valence bond or a $C_1$-$C_6$ alkylene moiety, and $R_{14}$ and $R_{15}$ are independently selected from a group consisting of a H, $C_1$-$C_6$ alkyl moiety and a carbonyloxyalkyl moiety [—(C=O)—O—$R_{16}$] where $R_{16}$ is a $C_1$-$C_6$ alkyl moiety;

n is a positive integer and further comprising a secondary polymer bearing a fluoroalcohol group, where the secondary polymer is selected from a group consisting of polyacrylates and polyacrylics.

2. The antireflective coating composition of claim 1, where the amino compound which is reacted has a concentration from 30 to 90 mole %, and the concentration of the hydroxyl compound which is reacted ranges from 10 to 70 mole %.

3. The antireflective coating composition of claim 1, where structure (1) is represented by structure (5)

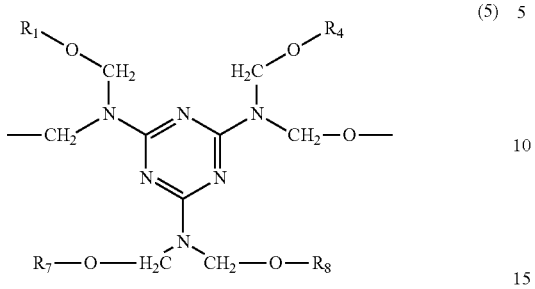

(5)

wherein $R_1$, $R_4$, $R_7$, $R_8$ are independently H or $C_1$-$C_4$ alkyl group.

4. The antireflective coating composition of claim 3, where in structure (5) $R_1$, $R_4$, $R_7$, $R_8$ are $C_1$-$C_4$ alkyl group.

5. The antireflective coating composition of claim 1 where structure (3) is selected from a group consisting of

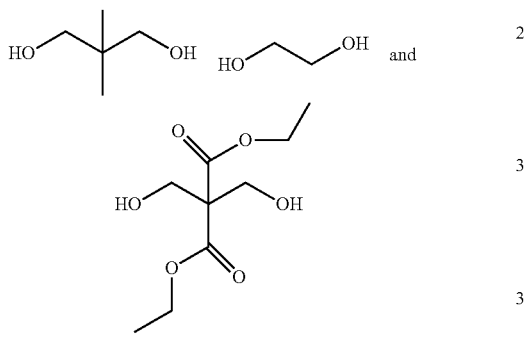

6. The antireflective coating composition of claim 1, wherein the thermal acid generator is selected from triarylsulfonium salts, aryldialkylsulfonium salts, dialkylarylsulfonium salts diaryliodonium salts, tosylates, derivatives of benzene sulfonic acid salts, alkylammonium and ammonium salts of fluoroakylsulfonic acid, and derivatives of naphthalene sulfonic acid salts.

7. The antireflective coating composition of claim 1, wherein refractive index value of the composition at 193 nm is below 1.65 and extinction coefficient is less than 0.3.

8. The antireflective coating composition of claim 1, wherein refractive index value of the composition is below 1.5 and extinction coefficient k is less than 0.2 at 193 nm.

9. The antireflective coating composition of claim 1, wherein refractive index value of the composition is in the range of 1.65 to 1.3 at 193 nm.

10. The antireflective coating composition of claim 1, where extinction coefficient is in the range of 0.05 to 0.3.

11. A process for forming an image on a photoresist comprising:
  (a) coating and baking a substrate with the anti-reflective coating composition of claim 1;
  (b) coating and baking a layer of photoresist film on top of the anti-reflective coating;
  (c) image-wise exposing the photoresist to radiation;
  (d) developing an image in the photoresist; and
  (e) optionally, baking the substrate after the exposing step.

12. The process of claim 11, where the photoresist is image-wise exposed at wavelengths between 10 nm to 450 nm.

13. The process of claim 11, where the photoresist is image-wise exposed at a wavelength of 193 nm.

14. The composition according to claim 1 where the secondary polymer is a polyacrylate type polymer having structure 7

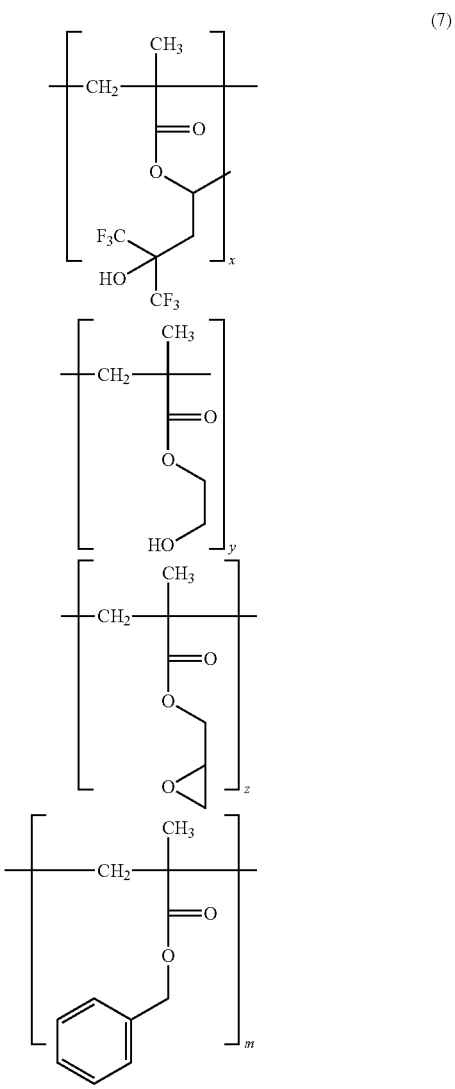

(7)

where x=10-50 mole %, y=0-40 mole %, z=0-40 mole %, y+z=20-60 mole %, m=0-30 mole %.

15. The composition according to claim 1 where the secondary polymer is a polyacrylate type polymer having structure 8

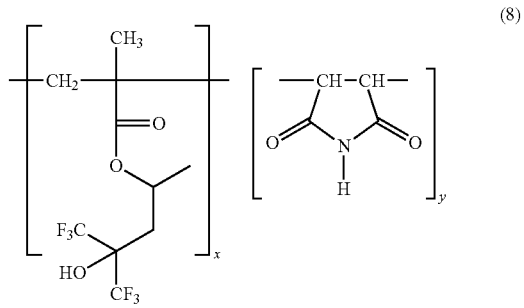

(8)

-continued

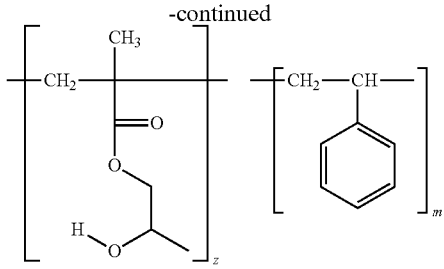

where x=10-50 mole %, y=0-40 mole %, z=0-40 mole %, =20-60 mole %, m=0-30 mole %.

16. The composition according to claim 1 where the secondary polymer is a polyacrylate type polymer having structure 9

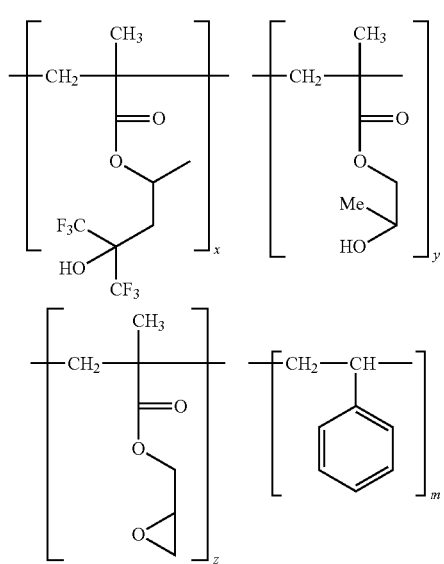

(9)

where x=10-50 mole %, y=0-40 mole %, z=0-40 mole %, y+z=20-60 mole %, m=0-30 mole %.

17. The composition according to claim 1 where the secondary polymer is a polyacrylate type polymer having structure 10

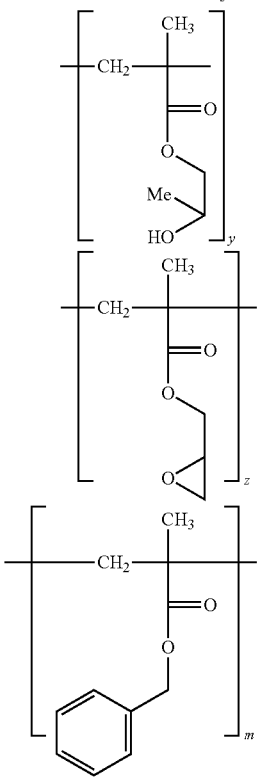

(10)

where x=10-50 mole %, y=0-40 mole %, z=0-40 mole %, y+z=20-60 mole %, m=0-30 mole %.

* * * * *